(12) United States Patent
Hochberg et al.

(10) Patent No.: US 7,792,393 B2
(45) Date of Patent: Sep. 7, 2010

(54) SILICON WAVEGUIDE PHOTODETECTOR AND RELATED METHOD

(75) Inventors: Michael J. Hochberg, Seattle, WA (US);
Tom Baehr-Jones, Seattle, WA (US);
Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/110,153

(22) Filed: Apr. 25, 2008

(65) Prior Publication Data

US 2009/0052830 A1 Feb. 26, 2009

Related U.S. Application Data

(60) Provisional application No. 60/926,402, filed on Apr. 26, 2007, provisional application No. 60/928,312, filed on May 8, 2007.

(51) Int. Cl.
*G02B 6/42* (2006.01)
(52) U.S. Cl. .......................................... 385/12; 385/31
(58) Field of Classification Search .................. 385/12, 385/31
See application file for complete search history.

(56) References Cited

U.S. PATENT DOCUMENTS

| 7,272,102 | B2 | 9/2007 | Challener |
| 2004/0156590 | A1 | 8/2004 | Gunn, III et al. |
| 2007/0189688 | A1* | 8/2007 | Dehlinger et al. ........... 385/129 |

OTHER PUBLICATIONS

T. Baehr-Jones, et al. entitled "*Photodetection in silicon beyond the band edge with surface states*" in Optics. Express, vol. 16. No. 3. Feb. 4, 2008, pp. 1659-1668.

* cited by examiner

*Primary Examiner*—Jerry T Rahll
(74) *Attorney, Agent, or Firm*—Steinfl & Bruno (57) ABSTRACT

A photodetector device, comprises an optical input, a nanoscale silicon waveguide and an electrical output. The waveguide is a high-contrast waveguide, with a refractive index contrast with the outside environment of more that 10%. The optical mode distribution across the waveguide has a peak intensity in correspondence of surface states of the nanoscale silicon waveguide. A related method is also disclosed.

18 Claims, 8 Drawing Sheets

SILICON WAVEGUIDE PHOTODETECTOR AND RELATED METHOD

CROSS REFERENCE TO RELATED APPLICATIONS

This application claims priority to U.S. Provisional Application 60/926,402 filed on Apr. 26, 2007 and U.S. Provisional Application 60/928,312 filed on May 8, 2007, the contents of both of which are incorporated herein by reference in their entirety.

STATEMENT OF GOVERNMENT INTEREST

The U.S. Government has certain rights in this invention pursuant to Grant DARPA HR0011-04-1-0054.

FIELD

The present disclosure relates to silicon waveguides. More in particular, it relates to a silicon waveguide photodetector and related method.

BACKGROUND

Silicon is an extremely attractive material platform for integrated optics at telecommunications wavelengths, particularly for integration with CMOS circuits. Low loss waveguides, high-Q resonators, high speed modulators, efficient couplers, and optically pumped lasers have been shown. Developing detectors and electrically pumped lasers at telecom wavelengths are the two main technological hurdles before silicon can become a comprehensive platform for integrated optics.

Silicon's bandgap of 1.12 eV makes it challenging to build a silicon-based detector in this near infrared. Silicon has minimal absorption of photons in this regime, at least in the bulk, defect-free case. Two-photon absorption can potentially be used to circumvent this limit and build a detector, but for practical power levels efficiency is poor. Approaches to detection have typically relied upon bonded III-V materials, on integrating Germanium or SiGe, or more recently, through volume defect creation via ion implantation.

A photocurrent has also been observed in undamaged silicon waveguides, and has been possibly attributed to an effect from the surface of the waveguide, though quantum efficiencies of only 0.24% were shown.

SUMMARY

According to a first embodiment of the present disclosure, a photodetector device is provided, comprising: an optical input: a nanoscale silicon waveguide having a refractive index contrast with the outside environment of more that 10%, the nanoscale silicon waveguide connected with the optical input; and an electrical output connected with the nanoscale silicon waveguide, wherein optical mode distribution across the nanoscale silicon waveguide has a peak intensity in correspondence of surface states of the nanoscale silicon waveguide.

According to a second embodiment of the present disclosure, a method for detecting light in a ultraviolet to infrared range through a nanoscale silicon waveguide is disclosed, comprising: inputting light to a nanoscale silicon waveguide having a refractive index contrast with the outside environment of more that 10%, an optical mode distribution across the nanoscale silicon waveguide being configured so that the optical mode has a peak intensity in correspondence of surface states of the nanoscale silicon waveguide; and outputting an electrical signal from the nanoscale silicon waveguide.

Further embodiments of the present disclosure can be found in its written specification, claims and drawings.

The present disclosure shows a photodetector based on surface states of a SOI ridge waveguide. Because the electric field is substantially enhanced near the surface of the waveguide by the high index contrast between the silicon and the low index cladding, photons are more efficiently absorbed, and a quantum efficiency of 2.8% is obtained.

The waveguide according to the present disclosure is specifically designed to take advantage of high confinement in order to enhance surface state based absorption.

DETAILED DISCLOSURE

It is well known that defect states can form at the edge of a crystalline semiconductor. Such defects are known to contribute substantially to the optical losses of silicon waveguides. Most low-loss silicon waveguide geometries involve fairly large silicon waveguides, on the scale of at least 0.450 µm×0.250 µm, and often more than 2 µm×0.9 µm.

According to one of the embodiments of the present disclosure, applicants instead use a nanoscale geometry of 0.5 µm×0.1 µm, obtaining losses of around 5 dB/cm. Further embodiments can include any waveguide having a geometry of less than 5×5 µm and with losses of less than 50 dB/cm.

Figure 1:
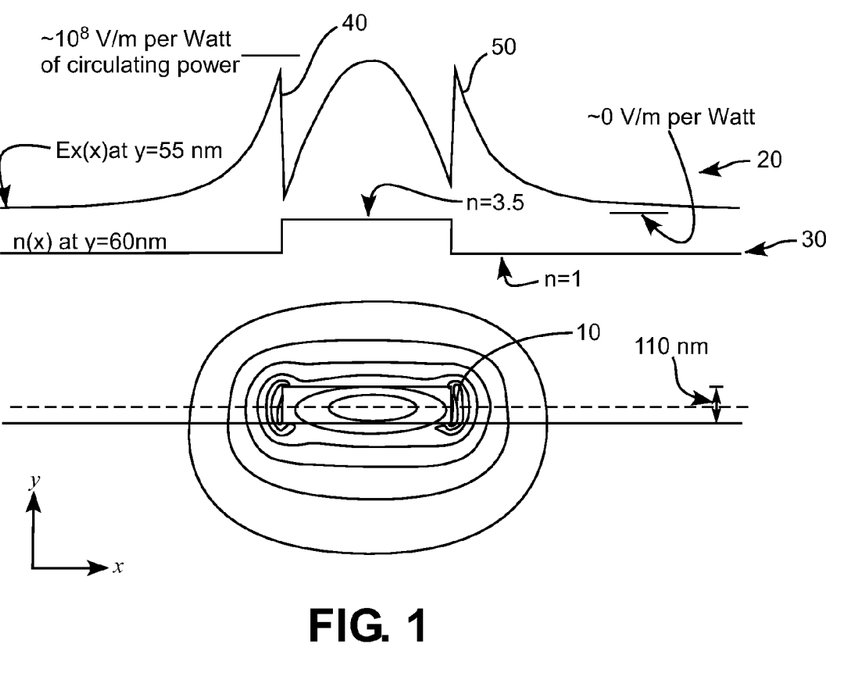
FIG. 1 shows a cross sectional view of a silicon waveguide, together with plots showing optical mode energy and refractive index.

FIG. 1 shows a cross sectional view of a silicon waveguide (10), together with plots showing optical mode energy (20) and refractive index (30). The modal patterns for the TE-1 mode is overlaid and the contours are drawn in |E| in increments of 10% of max value. For a propagating power of 1 W, the peak electric field will be 108 V/m. In addition, a plot of Ex across the center of the waveguide (dashed line) is shown.

The refractive index of the silicon waveguide (10) is n=3.5. The refractive index of the environment outside the silicon waveguide (10) is n=1. Therefore, there is a high contrast between the two refractive indexes. For purposes of the present disclosure, a high-contrast silicon waveguide like waveguide (10) of FIG. 1 will be defined as a waveguide where there is more than 10% difference between the refractive index of the silicon waveguide and the refractive index of the outside environment.

Polymers, oxides or air can be used as claddings. Loss comes primarily from three effects: scattering from residual lithographic roughness, absorption from surface states, and absorption from the bulk silicon. These surface states exist precisely where the optical mode field (20) of the waveguide is at its peak intensity (40), (50), because the electric field is normal to a high dielectric discontinuity. A grating coupler can be used to couple light from a standard fiber optic mode pattern into the waveguide, e.g., a ridge waveguide. In the following embodiments of the present disclosure, ridge waveguides contacted by a series of tiny, conductive arms will be used. The optical mode is tightly confined to the ridge waveguide, and does not appreciably touch the metal pads or the surrounding silicon layer.

Silicon waveguide devices like the one shown in FIG. 1 can be fabricated in electronics-grade SOI from Soitec, doped at around $10^{15}$ dopants (Boron)/cm$^3$. According to an embodiment of this disclosure, no implant or irradiation is performed on the silicon material. The starting material can be oxidation thinned to about 110 nm by dry oxidation, singulated into small chips, and patterned using electron-beam lithography on a 100 kV electron beam writer using HSQ (hydrogen silsesquioxane) resist. The samples can be etched with chlorine in an inductively coupled plasma etcher. After removing the residual resist and native oxide, photolithography and evaporation can be used to define and deposit aluminum electrodes. In this embodiment, there is no deposition of cladding layer.

A photocurrent effect was observed in the device described thus far. The most straightforward way of observing the photocurrent effect is to electrically contact the optically active area, and apply a bias voltage. The surface state absorption will change the conductivity of the device, and this will result in a photocurrent.

Two device types were studied: in type A, the grating couplers were contacted directly with large silicon arms. In type B, small silicon arms can be used to form contacts to the waveguide directly (see also FIG. 4); only around 0.2 dB of optical insertion loss is endured from 0.07 µm silicon arms.

Figure 2:
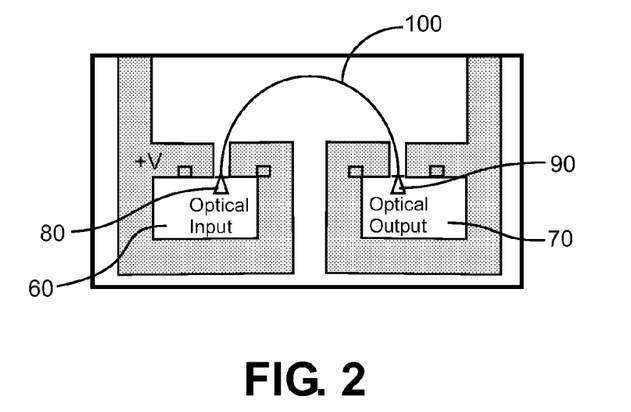
FIGS. 2 and 3 show top views of silicon ridge waveguides, with grating couplers and with electric bias applied on them to show occurrence of a photocurrent.
Figure 3:
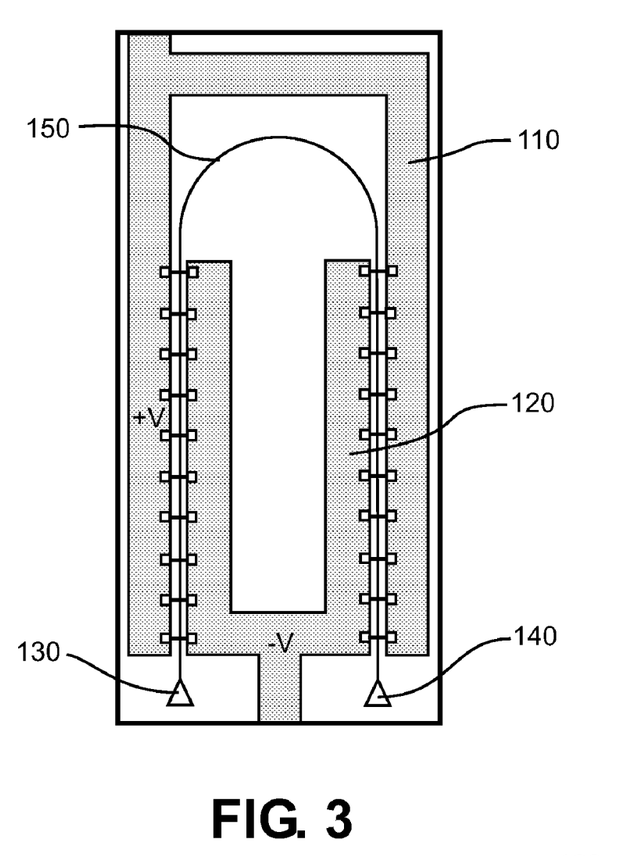

These two device layouts are shown in FIGS. 2 and 3. In particular, FIGS. 2 and 3 show top views of silicon ridge waveguides, with grating couplers and with electric bias applied on them to show occurrence of a photocurrent.

FIG. 2 shows a first electrode (60) and a second electrode (70). Grating coupler (80) forms the optical input of the waveguide and is directly connected to electrode or metal contact (60). Grating coupler (90) forms the optical output of the waveguide and is connected to electrode or metal contact (70). The waveguide forms a loop (100) between its optical input and output. In the embodiment of this figure, the photoconduction region is in the loop (100). The length of the photoconduction region is about 0.4 mm.

FIG. 3 shows a first electrode (110) and a second electrode (120). Grating couplers (130), (140) are connected to the electrodes by way of conduction arms, and a loop (150) is formed as shown. The photoconduction region is the intersection between the conduction arms and the loop. The length of the photoconduction region is about 1.5 mm, with 40 contacting arms contacting the loop to the conduction arms.

In both embodiments of FIGS. 2 and 3, light flows into one grating coupler, through the electrically contacted ridge waveguide, and finally out through another grating coupler.

Figure 4:
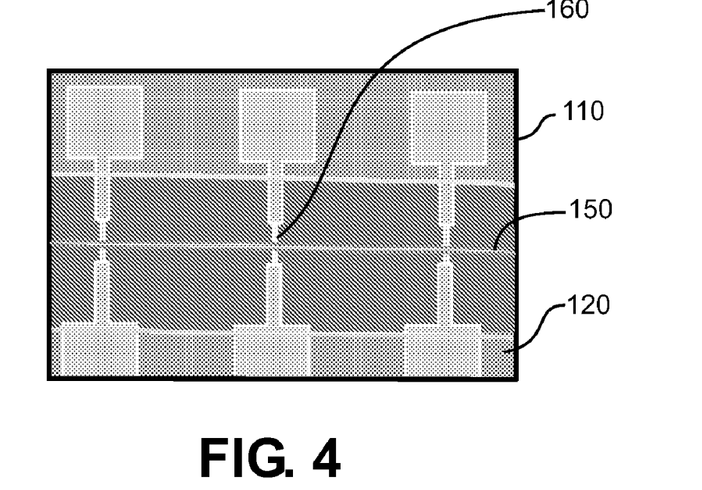
FIG. 4 shows a more detailed top view of a region between contacts, where a plurality of contacting arms touching the waveguide are also shown.

FIG. 4 shows a more detailed top view of the region between contacts (110) and (120) of FIG. 3, where a part of the loop (150) is shown, together with a plurality of conduction arms (160) touching the waveguide (150).

Figure 5:
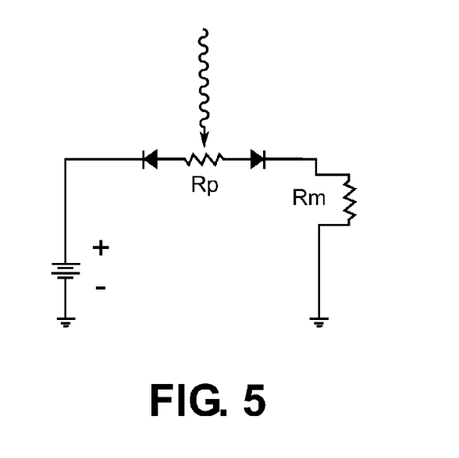
FIG. 5 shows an equivalent electrical circuit of the structure shown in FIGS. 2 and 3.

FIG. 5 shows an equivalent electrical circuit of the structure shown in FIGS. 2 and 3, where Rp is the photoconductive resistor and Rm the resistance of the measuring apparatus. The diodes present in the circuit are due to the metal-semiconductor interface.

It is important to note that the optical field is separated by tens of microns from the region where the metal pads or contacts touch the silicon for both devices. No propagating mode is supported along the tiny conductive arms, and the insertion loss due to each arm is minimal, as confirmed by both simulation and measurement. This is significant, as a Schottky barrier can result in a photocurrent for near infrared radiation on the basis of internal photoemission. If the optical mode did touch the metal-silicon barrier, this could be a possible source of the photocurrent that is observed, but the geometry used excludes this possibility.

According to an embodiment of the present disclosure, the devices shown in FIGS. 2 and 3 were first characterized by coupling a continuous wave laser at 1575 nm through the input couplers (80) or (130), and measuring the DC current that flowed in response to a series of voltages.

Figure 6:
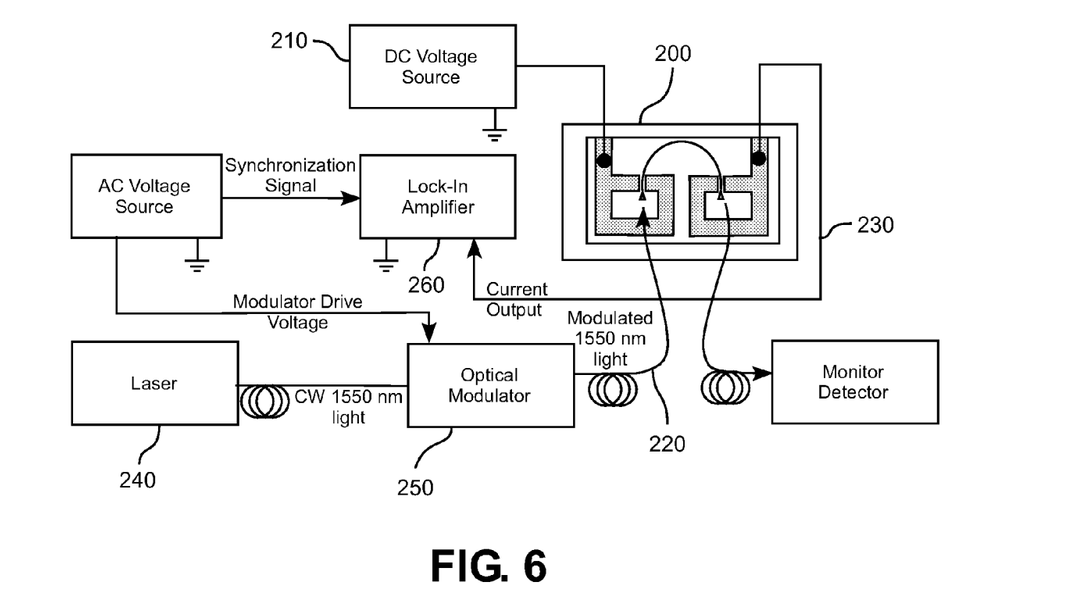
FIG. 6 shows a schematical diagram of an exemplary experimental setup for the embodiment of FIG. 2.

FIG. 6 shows a schematical diagram of an exemplary experimental setup for the embodiment of FIG. 2.

A silicon chip (200) containing the silicon waveguide already shown in FIG. 2 is connected to a DC voltage source (210) and has an optical input (220) and a current output (230). The optical input comes from a laser (240) and optical modulator (250), while the observed current output (230) goes to a lock-in amplifier (260). In case of DC I-V curves, the lock-in amplifier can be replaced with a picoammeter.

Figure 7:
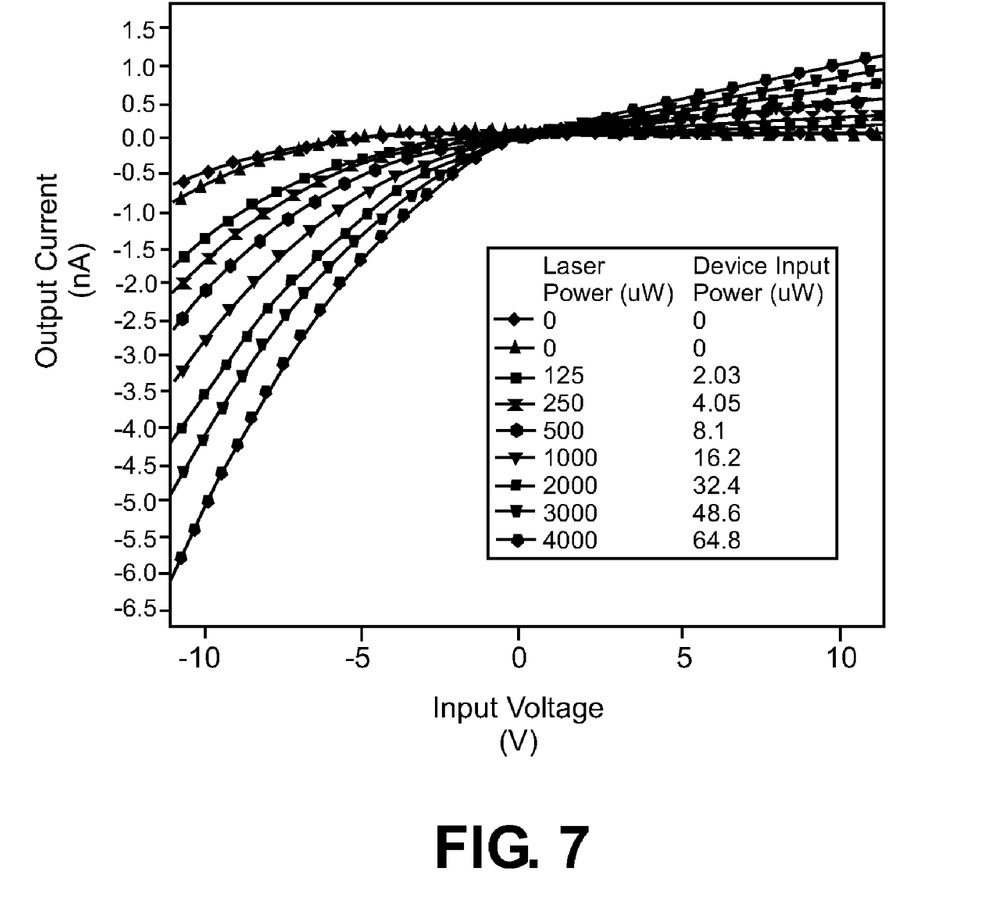
FIGS. 7, 8 and 9 show measured I-V curves for the two devices of FIGS. 2 and 3.
Figure 8:
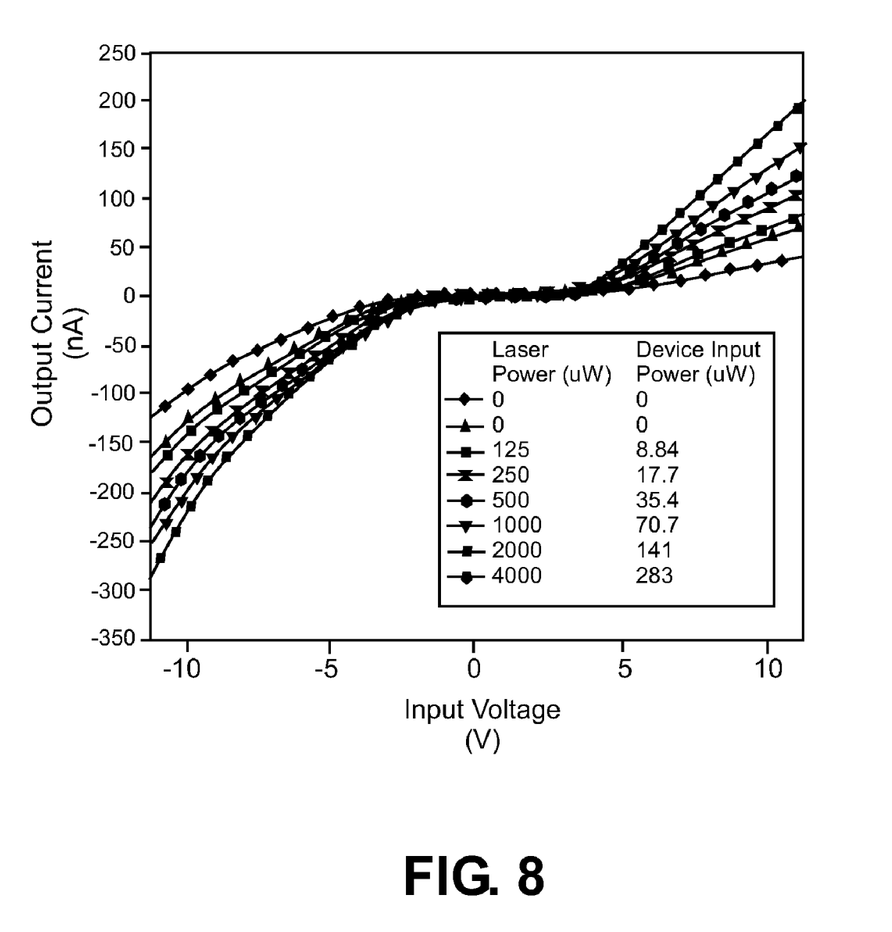
Figure 9:
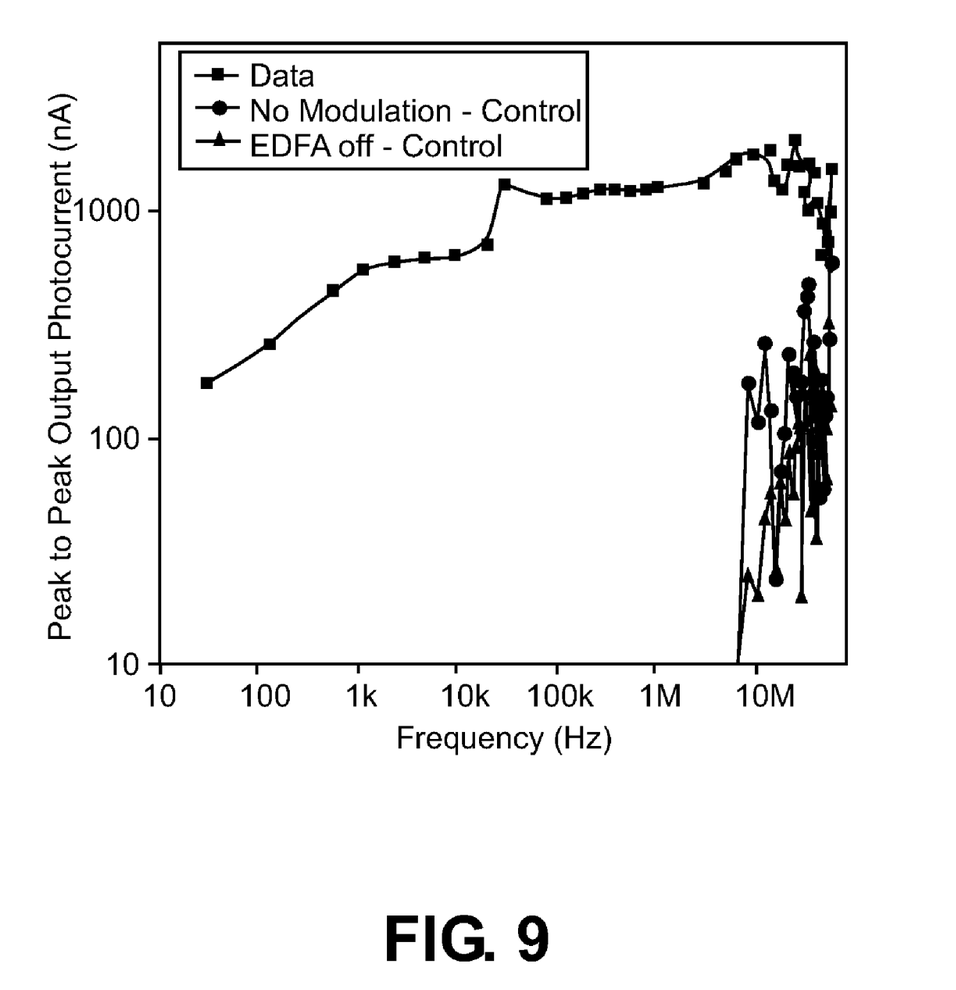

The measured I-V curves for the two devices studied in FIGS. 2 and 3 are shown in FIGS. 7, 8 and 9. In particular, FIG. 7 shows DC I-V curves for the device of FIG. 2, and FIG. 8 shows DC I-V curves for the device of FIG. 3. The power of the test laser used, as well as the propagating laser power in each device is labeled. Slightly different optical paths used in each series of tests result in different levels of propagating power for the same laser power. Current in nA is plotted against voltage in V.

FIG. 7 shows significantly more rectifying behavior than FIG. 8, because there are only two small contacts to the waveguide in the case of FIG. 2, while in the case of FIG. 3 there were 40 contacts to the guide.

FIG. 9 shows the peak to peak output photocurrent of a further device similar to the one shown in FIG. 3 as a function of frequency. There is minimal change in performance from DC to approximately 60 MHz, where testing was stopped due to limitations of the noise environment where the devices were being tested.

The propagating power shown is the power in the waveguide after the loss due to the grating coupler and other parts of the optical test apparatus. For the data shown, input light at 1575 nm was used. In the case with no incident radiation, the data show the effect of the rectifying contact created by an aluminum electrode on top of lightly p-type silicon. This rectification limits device performance, and decreases the quantum efficiency as a result. Ohmic contacts can easily be formed in future devices with contact doping and annealing. By constraining a heavy p-doping to the pad region only, it should be possible to minimize rectifying behavior, while leave optical behavior unchanged.

When light is incident on the waveguide, a photocurrent is observed when the device is under bias. The current across the device increases along with the laser intensity. For high power, the device response is not linear in laser power, but shows sub-linear behavior; this is attributable to the rectifying contact in series with the photoconductor.

In the best case for the device of FIG. 2, the direct current responsivity at an 11 V bias is 0.1 mA/W, while for the device of FIG. 3 the responsivity in the best case is 1.5 mA/W, corresponding to a quantum efficiency of 0.12%. One of the reasons that the performance of the device of FIG. 3 is superior is that it has far more semiconductor-metal contacts, allowing more current to flow. It is also possible that the tiny arms (160) connecting the waveguide (150) to the electrodes present additional surface states where optical absorption can occur. Finally, it can be shown that excess electrons and holes can only be cleared from a small portion, around 10 μm of waveguide, from the device of FIG. 2. Therefore, devices like the one of FIG. 2 had much smaller effective lengths than devices of the type of FIG. 3. The device of FIG. 3 was also measured at lower input powers, where performance improved, and the device response became linear.

The device of FIG. 3 was measured at higher powers by means of an Erbium-Doped Fiber Amplifier (EDFA), with around 10 mW of power propagating in the waveguide. A lock-in amplifier was also used to precisely measure the output current, as shown in FIG. 9. A responsivity of 0.12 mA/W at 7 MHz was obtained, with nearly flat performance in frequency; from 1 KHz to 60 MHz, the responsivity changes by only a factor of 3. The slight nonuniformity seen is likely due to electronic parasitics, and perhaps the testing environment. At lower frequencies, the larger increase in response from DC to 1 KHz is likely due to some sort of parasitic capacitive coupling in the metal-semiconductor contact. Applicants believe that the device would continue to perform past 60 MHz, however environmental noise precludes measurements at these higher speeds. The lowered responsivity compared to the results for the device of FIG. 3 is due to the large amounts of power used in testing at high frequencies.

It should be pointed out that the two controls listed in FIG. 9 dramatically increase at higher frequencies. This is a result of increasing radiative cross talk between the lock-in and the function generator at higher frequencies.

Further information on the high speed performance of the effect was obtained by alloptical measurements, which are detailed elsewhere and known as such to the person skilled in the art. Based on these measurements, the effect involved is extremely fast, and it is likely that with proper supporting electronics, a detector with speeds in the Gigahertz can be constructed. The ultimate limit of the device will likely be the time it takes to sweep free carriers across a micron scale silicon device. This speed can easily exceed 10 GHz.

These measurements were also performed with similar devices that were clad in PMMA (Poly(methyl methacrylate)), rather than exposed to the atmosphere. A similar level of photocurrent was observed, with very similar performance.

It was observed that for larger optical intensities, the dependence of the photocurrent was sublinear, in that doubling the optical input intensity resulted in less than a 2× increase in photocurrent. To better understand the photocurrent process, as well as to estimate the performance in the absence of a rectifying contact, a Princeton Research 5210 lock-in amplifier was used to characterize the photocurrent as a function of optical power. A time constant of 3 s was used for an excitation frequency of 1 KHz, and an input wavelength of 1575 nm. A lithium niobate optical modulator was used to impose a sinusoidal variation on the input intensity, producing a sinusoidally varying photocurrent. The incoming intensity wave is chosen to have nearly full extinction at its lowest point, implying the average power is roughly half of the peak to peak power swing.

Figure 10:
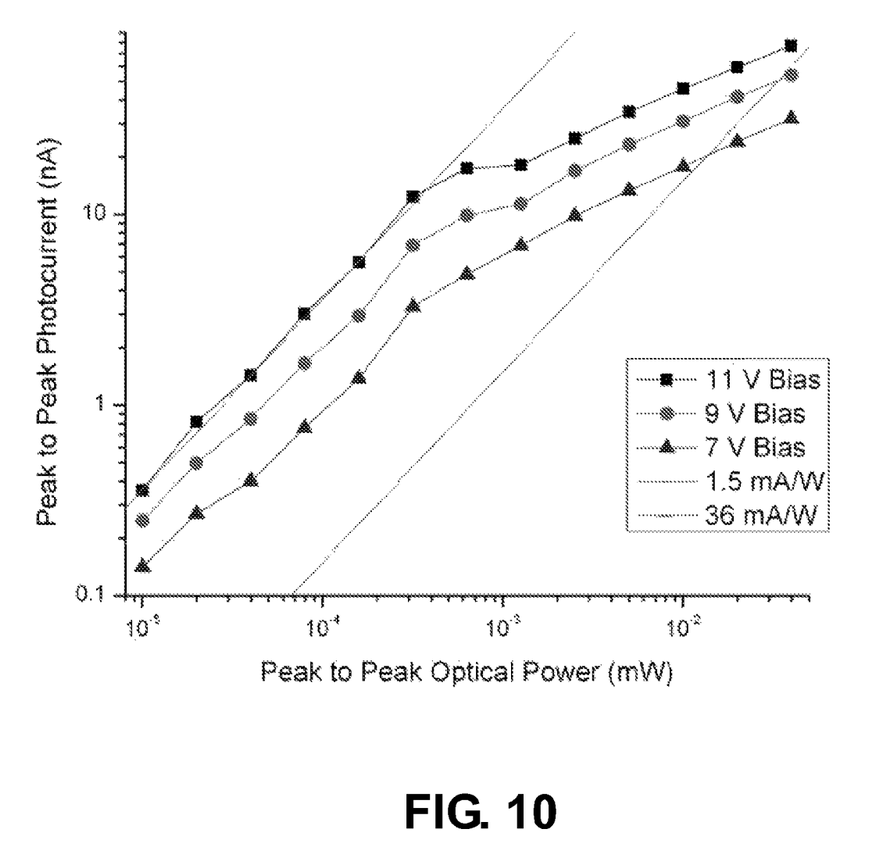
FIGS. 10 and 11 show the photocurrent as a function of power for several bias voltages, with measurements taken for the device of FIG. 3.
Figure 11:
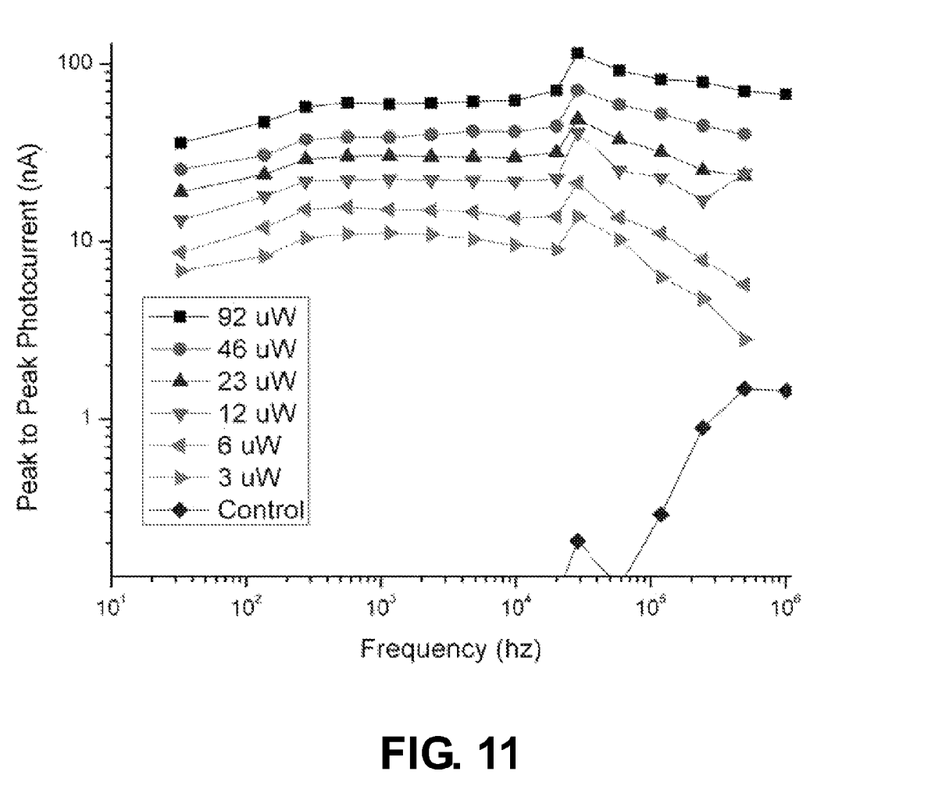

FIGS. 10 and 11 show the photocurrent as a function of power for several bias voltages, with measurements taken for the device of FIG. 3. FIG. 10 shows photocurrent as a function of propagating laser power for several bias voltages. The peak-to-peak photocurrent in nA is shown as well as the peak-to-peak optical power in the waveguide in mW. The responses that would be observed with a perfectly linear 1.5 mA/W and 36 mA/W detector are also shown. FIG. 11 shows the photocurrent in peak to peak nA of the device for a 11 V bias voltages and several peak to peak laser powers as a function of frequency up to 1 MHz. In both cases, a logarithmic plot has been used.

The responsivity continues to improve for lower optical powers, eventually becoming linear, an effect that is readily explained by the presence of a reverse biased diode, the character of which is seen in the DC curves in FIGS. 7 and 8. In the best case, a linear responsivity of 36 mA/W is obtained, corresponding to a quantum efficiency of 2.8% for an 11 V bias. It is worth noting that for higher optical power levels, the responsivity observed with DC measurements is approached.

Applicants believe that in the future, more optimal electrode and device geometries will enable the device to demonstrate linear responsivity at much higher optical powers. This could be achieved on the basis of doping the silicon to increase the conductivity, and by pad implants to decrease the contact resistance.

Heating and two-photon absorption have been excluded as a significant mechanism of what shown above, as shown in "*Photodetection in silicon beyond the band edge with surface states*", Optics Express, Vol. 16, No. 3, 4 Feb. 2008, 1659-1668, incorporated herein by reference in its entirety.

Mechanism and Identification of Surface States as Source of Photoconductivity

The precise mechanism of the photocurrent is unclear at present. One possibility is that electrons and holes are being created, despite the fact that the photon energy does not exceed the band gap's energy. Another possibility is that only free holes are being created, and the surface state creates a mid-bandgap acceptor state.

Further considerations are shown in "*Photodetection in silicon beyond the band edge with surface states*", Optics Express, Vol. 16, No. 3, 4 Feb. 2008, 1659-1668, incorporated herein by reference in its entirety.

Calculation of the Surface State Density

The strength of the surface state absorption effect can be characterized by a surface state density, σ in units of watts$^{-1}$ s$^{-1}$ cm$^{-1}$. It identifies the product of the number of surface states and the optical absorption probability per unit of waveguide. Also such calculation is shown in "*Photodetection in silicon beyond the band edge with surface states*", Optics Express, Vol. 16, No. 3, 4 Feb. 2008, 1659-1668, incorporated herein by reference in its entirety.

The present disclosure shows that surface-state absorption is an important component of waveguide losses in nanoscale silicon waveguides. Measurement of the photoconductivity of waveguide samples could become a useful tool in loss optimization.

More generally, the present disclosure shows that novel material functionality can sometimes be obtained by using nanoscale lithography to access and enhance surface effects.

Accordingly, what has been shown is a silicon waveguide photodetector and a related method. While the silicon waveguide photodetector and related method have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

What is claimed is:

1. A photodetector device, comprising:
   an optical input:
   a nanoscale silicon waveguide having a refractive index contrast with the outside environment of more that 10%, the nanoscale silicon waveguide connected with the optical input; and
   an electrical output connected with the nanoscale silicon waveguide, wherein optical mode distribution across the nanoscale silicon waveguide has a peak intensity in correspondence of surface states of the nanoscale silicon waveguide.

2. The photodetector device of claim 1, wherein the electrical output is originated due to surface state absorption of the nanoscale silicon waveguide.

3. The photodetector device of claim 1, wherein the optical input has a wavelength ranging from ultraviolet to infrared.

4. The photodetector device of claim 3, wherein the optical input has a near infrared wavelength.

5. The photodetector device of claim 1, wherein the nanoscale silicon waveguide is connected to the optical input through a grating coupler.

6. The photodetector device of claim 1, wherein the nanoscale silicon waveguide comprises an optically active area.

7. The photodetector device of claim 6, wherein the optically active area of the nanoscale silicon waveguide is an electrically contacted optically active area.

8. The photodetector device of claim 7, wherein a bias voltage is applied to the electrically contacted optically active area.

9. The photodetector device of claim 8, wherein the electrically contacted optically active area is electrically contacted to a metal contact through a plurality of conductive contacting arms.

10. The photodetector device of claim 1, wherein the nanoscale silicon waveguide is a slot waveguide.

11. The photodetector device of claim 1, wherein the nanoscale silicon waveguide is a ridge waveguide.

12. The photodetector device of claim 11, further comprising a first voltage contact and a second voltage contact, wherein the ridge waveguide contacts the first voltage contact by way of a plurality of conductive contacting arms, and the second voltage contact is the electrical output of the photodetector device.

13. A method for detecting light in a ultraviolet to infrared range through a nanoscale silicon waveguide, comprising:
    inputting light to a nanoscale silicon waveguide having a refractive index contrast with the outside environment of more that 10%, an optical mode distribution across the nanoscale silicon waveguide being configured so that the optical mode has a peak intensity in correspondence of surface states of the nanoscale silicon waveguide; and
    outputting an electrical signal from the nanoscale silicon waveguide.

14. The method of claim 13, wherein detected light has a near infrared wavelength.

15. The method of claim 13, wherein light is input to the nanoscale silicon waveguide through a grating coupler.

16. The method of claim 13, further comprising associating a first and a second metal contact with the nanoscale silicon waveguide, wherein the first metal contact is connected to the nanoscale silicon waveguide through a plurality of conductive arms and the second metal contact is for the outputting of the electrical signal from the nanoscale silicon waveguide.

17. The method of claim 16, further comprising applying a bias voltage to the first metal contact.

18. The method of claim 13, wherein the nanoscale silicon waveguide is a slot waveguide or a ridge waveguide.

* * * * *